(12) United States Patent
Aue et al.

(10) Patent No.: US 9,100,037 B2
(45) Date of Patent: Aug. 4, 2015

(54) METHOD FOR EVALUATING AN ANALOG SIGNAL BY EVALUATING DIGITAL DATA CORRESPONDING TO THE ANALOG SIGNAL TO DETERMINE ZERO CROSSINGS OF THE ANALOG SIGNAL

(75) Inventors: Axel Aue, Korntal-Muenchingen (DE); Dieter Thoss, Schwieberdingen (DE); Martin Gruenewald, Vaihingen/Enz (DE)

(73) Assignee: ROBERT BOSCH GMBH, Stuttgart (DE)

( * ) Notice: Subject to any disclaimer, the term of this patent is extended or adjusted under 35 U.S.C. 154(b) by 365 days.

(21) Appl. No.: 13/582,871

(22) PCT Filed: Mar. 1, 2011

(86) PCT No.: PCT/EP2011/052996
§ 371 (c)(1),
(2), (4) Date: Nov. 20, 2012

(87) PCT Pub. No.: WO2011/110446
PCT Pub. Date: Sep. 15, 2011

(65) Prior Publication Data
US 2013/0063162 A1    Mar. 14, 2013

(30) Foreign Application Priority Data
Mar. 9, 2010    (DE) .......................... 10 2010 002 695

(51) Int. Cl.
| | |
|---|---|
| *G01B 7/30* | (2006.01) |
| *H03M 1/12* | (2006.01) |
| *G01D 5/20* | (2006.01) |
| *G01D 5/244* | (2006.01) |
| *G01P 3/48* | (2006.01) |
| *G01P 3/481* | (2006.01) |
| *H03M 1/64* | (2006.01) |

(52) U.S. Cl.
CPC ............. *H03M 1/129* (2013.01); *G01D 5/2013* (2013.01); *G01D 5/2448* (2013.01); *G01P 3/481* (2013.01); *G01P 3/4802* (2013.01); *H03M 1/645* (2013.01)

(58) Field of Classification Search
None
See application file for complete search history.

(56) References Cited

U.S. PATENT DOCUMENTS

| 4,449,191 A | 5/1984 | Mehnert | |
|---|---|---|---|
| 4,908,572 A * | 3/1990 | Sakai et al. | .................. 324/173 |

(Continued)

FOREIGN PATENT DOCUMENTS

| CN | 1722560 | 1/2006 |
|---|---|---|
| CN | 101026300 | 8/2007 |

(Continued)

OTHER PUBLICATIONS

Santanu Sarma et al, "Software-Based Resolver-to-Digital Conversion Using DSP", IEEE Transactions On Industrial Electronics, IEEE Service Center, Piscataway, NJ, USA, Bd. 54, Nr. 1, Jan. 1, 2008, pp. 371-379.

(Continued)

*Primary Examiner* — Minh N Tang
(74) *Attorney, Agent, or Firm* — Kenyon & Kenyon LLP

(57) ABSTRACT

A method for evaluating an analog signal of an inductive sensor that carries data on a rotational motion includes directly connecting the inductive sensor to an A-D converter via resistors, and reading in the analog signal by the A-D converter to emit digital data. The digital data is evaluated to determine zero crossings of the analog signal.

9 Claims, 2 Drawing Sheets

(56) References Cited

U.S. PATENT DOCUMENTS

| | | | |
|---|---|---|---|
| 5,455,498 A | 10/1995 | Kakimoto et al. | |
| 6,668,666 B1 | 12/2003 | Chen et al. | |
| 7,082,178 B2 * | 7/2006 | Meltzer | 375/376 |
| 7,589,656 B2 * | 9/2009 | Aspelmayr et al. | 341/155 |
| 7,593,827 B2 | 9/2009 | Kambe et al. | |
| 2005/0235028 A1 * | 10/2005 | Kirschner et al. | 708/800 |

FOREIGN PATENT DOCUMENTS

| | | |
|---|---|---|
| DE | 103 23 498 | 12/2004 |
| DE | 602 23 898 | 11/2008 |
| JP | 3-36229 | 4/1991 |
| JP | 4-15519 | 1/1992 |
| JP | 2004-210247 | 7/2004 |
| JP | 2006 071547 | 3/2006 |
| JP | 2006-234555 | 9/2006 |
| JP | 2007-500480 | 1/2007 |
| JP | 2007-213260 | 8/2007 |

OTHER PUBLICATIONS

Rizzoni, G., et al., "Onboard Detection of Internal Combustion Engine Misfires", 19901018; 199010180-019901019, Oct. 18, 1990, pp. 39-49.

Ahmed, T., et al., "Advanced Control Of A Boost ACUDC PWM Rectifier for Variable-Speed Induction Generator", Applied Power Electronics Conference and Exposition, 2006, APEC '06, Twenty-First Annual IEEE, Mar. 19, 2006, Piscataway, NJ, USA, IEEE, Piscataway, NJ, USA, Mar. 19, 2006, pp. 956-962.

Joachim Holtz, "Sensorless Control of Induction Motor Devices", Proceedings of the IEEE, IEEE. New York, US, vol. 90, No. 8, Aug. 1, 2002.

International Search Report for PCT/EP2011/052996, dated May 4, 2011.

* cited by examiner

METHOD FOR EVALUATING AN ANALOG SIGNAL BY EVALUATING DIGITAL DATA CORRESPONDING TO THE ANALOG SIGNAL TO DETERMINE ZERO CROSSINGS OF THE ANALOG SIGNAL

BACKGROUND OF THE INVENTION

1. Field of the Invention

The present invention relates to a method for evaluating an analog signal which carries data to form a rotational motion, and a circuit configuration, for evaluating an analog signal, which is particularly suitable for carrying out the method.

2. Description of the Related Art

In turning or rotating bodies, data are picked up on these rotational motions using sensors. In this connection, for instance, inductive sensors are used. Data on the rotational speed and the position of the body are gathered by evaluating the signal.

Known circuit configurations on conditioning the rotational speed signal via inductive sensors are based on the principle that an analog circuit, such as a comparator having threshold tracking is used in order to be able to evaluate well the problem of different heights of input voltages at different rotational speeds.

These circuit configurations, however, have the disadvantage that the evaluation circuit is costly. Furthermore, however, especially in the low-end segment, that is, in the segment in which simple design approaches are used, in particular inductive sensors are increasingly being used, since they are cost-effective.

BRIEF SUMMARY OF THE INVENTION

In the present invention, a conditioning is proposed which makes do with standard components of digital technology and is thus substantially able to be integrated, and, based on the smaller execution, is more cost-effective.

At high input voltages, reading in is performed via an input, and thereby ca. 2.5 V resolution is achieved in response to a 150 V input signal. At low input voltages, for instance, during the starting of the engine, a second input is used which has a substantially lower maximum value, such as 5 V, and thus has a resolution of ca. 80 mV. Alternatively, only one single A-D converter may be used, which has an input voltages range of, for example, 5 V, and limits all larger signals, provided only the zero crossings of the signal are evaluated.

In this context, the A-D converter converts one of the two ranges very rapidly, such as using 500 ns conversion time. Using digital signal conditioning in the processor, from this input signal the rotational speed signal is detected, including the possibility of calculating digital filters.

Other embodiments may include the use of an A-D converter having more or fewer bits or the use of only one A-D channel for reading in.

Additional advantages and developments of the present invention result from the specification and the appended figures. It is understood that the features mentioned above and still to be explained below may be used not only in the respectively indicated combination, but also in other combinations, or by themselves, without departing from the scope of the present invention.

DETAILED DESCRIPTION OF THE INVENTION

Figure 1:
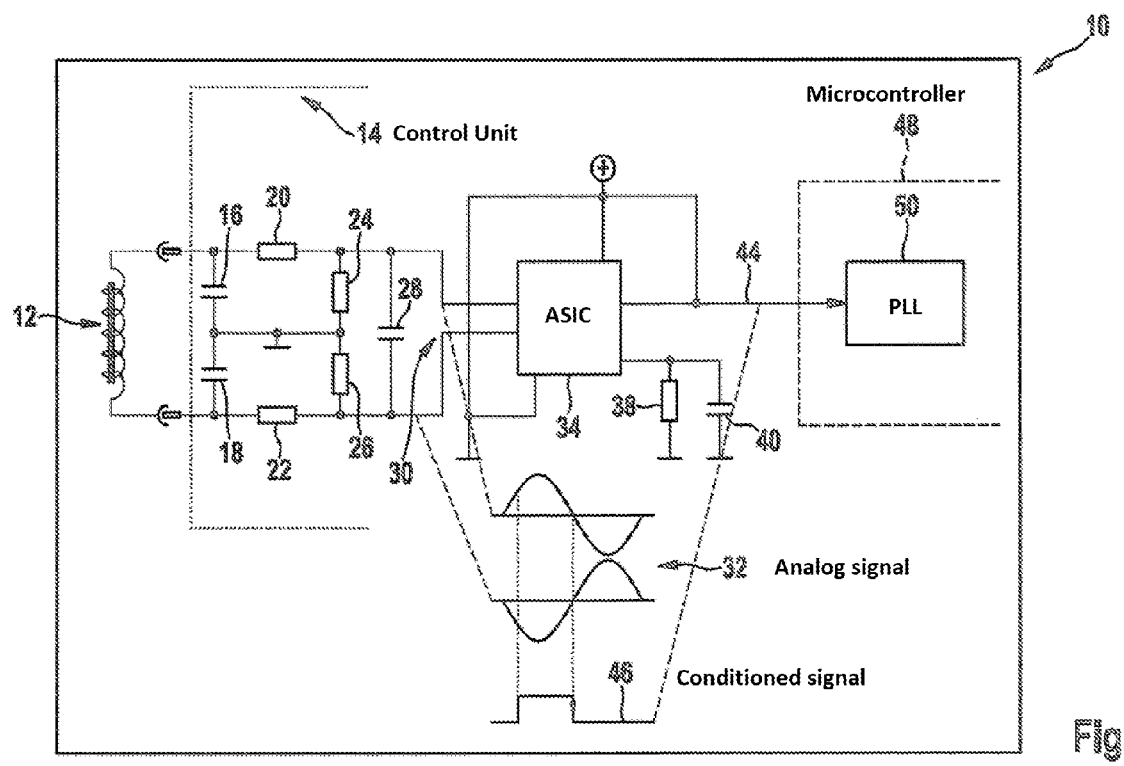
FIG. 1 shows a circuit configuration according to the related art.

FIG. 1 provides a representation of a circuit configuration which is indicated as a whole by reference numeral 10. This circuit configuration 10 is used for a crankshaft, for example.

The illustration shows an inductive sensor 12, which is connected to a control unit 14. In this control unit there are provided a first capacitor 16, a second capacitor 18, a first resistor 20, a second resistor 22, a third resistor 24, a fourth resistor 26, a third capacitor 28, a fifth resistor 38 and a fourth capacitor 40. At output 30 an analog signal 32 is present, which gives data on the rotation of a body to be investigated, such as a crankshaft. Analog signal 32 is input into an ASIC 34 for additional conditioning.

At output 44 of ASIC 34, a conditioned signal 46 is output, which is read in to a microcontroller 48 for evaluation and in addition, into a phase locked loop PLL (PLL: phase locked loop) 50.

It should be noted that inductive crankshaft sensors are used, since these, in comparison to Hall sensors, are cost-effective, robust and very precise. It is true that these, in contrast to Hall sensors, which are able to be connected directly to a microcontroller, supply an analog signal that has to be specially processed. Up to now, as is also shown in FIG. 1, this has been carried out using special application-specific components, in this case, using the ASIC 34.

It is true that it is considered as being advantageous to save having to use this ASIC 34, and to read in analog signal 32 of inductive sensor 12 directly using micro-controller 48. It is thereby supposed to be achieved that one use an A-D converter of a microcontroller to read in the analog signal and to carry out all additional conditioning digitally in the microprocessor.

This, however, is not easy to achieve, since the amplitude of the sensor signal is proportional to the rotational speed of the crankshaft. This speed is able to vary in a range of more than 1:1,000, namely at a cold start of the engine below 20 r.p.m. up to a maximum speed of the engine above 20,000 r.p.m. The amplitude of the signal behaves correspondingly. This is able to vary from about 100 mV$_p$ (mV peak) to about 100 V$_p$.

In particular at low speed, the signal is sensitive to interference. Since screening is usually too costly, symmetrical wiring between the sensor and the engine control unit (ECU) is frequently used.

Moreover, it should be noted that the sensor signal has no direct component, and therefore the offset error of the A-D converter is unimportant. It may be compensated completely using software, for instance. An error of amplification also shows no effect, since the absolute value of the signal is unimportant.

With regard to the scanning frequency, one should note that the sensor signal is nearly sine-shaped having a few subharmonic portions about a marking having 1 to 3 missing teeth. Consequently, in heavy trucks a scanning frequency $f_s$ of about 20 kHz and in the case of motorcycles of about 100 kHz is sufficient.

In the resolution of the A-D converter one should note that the resolution $V_{res}$ of the A-D converter has to be sufficiently high so as to reach the required angular resolution $\Phi_{res}$ FIG. 1 shows how the signal is processed or conditioned by inductive sensor 12 having resistors 20, 22, 24 und 26.

Capacitors 16 and 18 are used for the protection from electrostatic discharge (ESD) and electromagnetic interference (EMI). Capacitor 28 is used for interference suppression.

ASIC 34 uses an analog comparator in order to record the zero crossing of signal 32. At a zero crossing, ASIC 34 generates a pulse at its digital output. This digital output drives the timer units in microcontroller 48. ASIC 34 has a differential input.

Figure 2:
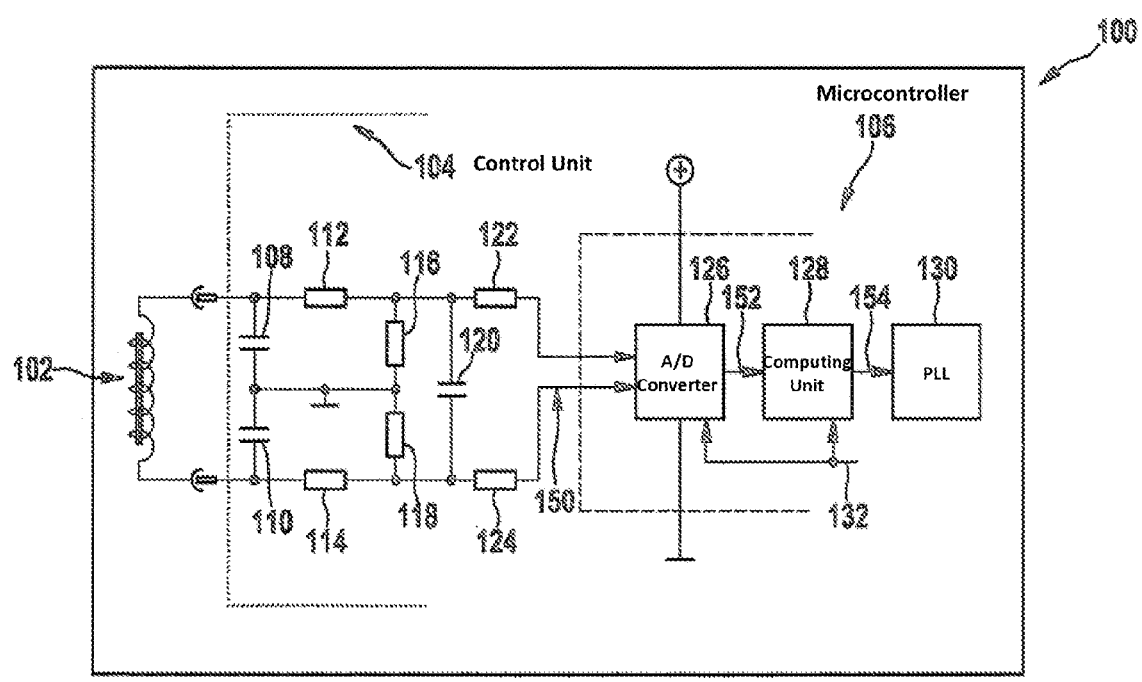
FIG. 2 shows a specific embodiment of the circuit configuration according to the present invention.

A circuit configuration 100 according to the present invention is shown in FIG. 2. The representation shows an inductive sensor 102, a control unit 104 and a microcontroller 106.

Control unit 104 has a first capacitor 108, a second capacitor 110, a first resistor 112, a second resistor 114, a third resistor 116, a fourth resistor 118, a third capacitor 120, a fifth resistor 122 and a sixth resistor 124.

Microcontroller 106 includes an A-D converter 126, a computing unit 128, on which a software or rather a software block is stored, and a PLL 130. The scanning frequency $f_s$ 132 is specified.

Consequently, no ASIC is provided in the circuit configuration according to FIG. 2. A conditioned signal at the output of control unit 104, which represents the analog signal 150 that is to be evaluated, directly drives the differential input of A-D converter 126. Resistors 122 and 124 limit the current, so that A-D converter 126 is not damaged by overloading (clipping). Consequently, inductive sensor 102 is connected directly to A-D converter 126. A-D converter 126 outputs scanning values (samples) 152. The software block on computing unit 128 outputs time stamps 154.

In so-called clipping, it should be noted that the required number of bits is able to be reduced if the A-D converter is overloaded. This is possible, since only the zero crossings of signal 150 are of interest. Only a small range about zero has to be digitized so as to make possible the interference suppression algorithms. The rest of the signal may be clipped.

The A-D converter supplies scanning values 152 having the constant rate of $f_s$ 132. The software, which runs on computing unit 128, converts these to time stamps 154 of the zero crossings.

At each scanning point in time (e.g. each 20 μs @ $f_s$=50 Hz) an interpolation routine is called up, which seeks a zero crossing. When a zero crossing occurs, the interpolation routine uses a so-called cubic spline (cubic interpolation) or another suitable algorithm, in order to determine the time of the zero crossing. This time stamp 154 is the output to digital PLL 130 of the timer unit of microcontroller 106. From this point on, the additional processing takes place as known.

In this way, for instance, the rate of rotation or the rotational speed of the body, but also its position or angular position may be ascertained.

The invention claimed is:

1. A method for evaluating an analog signal of an inductive sensor, which carries data on a rotational motion, comprising:
    directly connecting the inductive sensor to an A-D converter via resistors;
    reading in the analog signal by the A-D converter to emit digital data corresponding to the analog signal; and
    evaluating the digital data to determine zero crossings of the analog signal;
    wherein the resistors limit a current so that the A-D converter is not damaged by overloading.

2. The method as recited in claim 1, wherein the zero crossings are determined using an interpolation routine.

3. The method as recited in claim 2, wherein, based on the evaluation, a position of a rotating body is determined.

4. The method as recited in claim 2, wherein, based on the evaluation, a rotational speed of a rotating body is determined.

5. The method as recited in claim 2, further comprising:
    clipping the digital data to limit, prior to the evaluating, the digital data to within a range of the zero crossings of the analog signal.

6. The method as recited in claim 5, wherein the digital data emitted by the A-D converter are used for an interference suppression algorithm.

7. A circuit configuration, comprising:
    an inductive sensor which carries data on a rotational motion;
    an A-D converter reading in an analog signal of the inductive sensor to emit digital data corresponding to the analog signal, wherein the inductive sensor is connected directly to the A-D converter via resistors, the resistors limiting a current so that the A-D converter is not damaged by overloading; and
    a computing unit that determines zero crossings of the analog signal by evaluating the digital data.

8. The circuit configuration as recited in claim 7, a wherein the computing unit is configured to output time stamps that indicate times when the zero crossings occurred.

9. The circuit configuration as recited in claim 8, wherein the A-D converter is part of a microcontroller, and wherein the microcontroller further includes a PLL configured to process the time stamps.

* * * * *